United States Patent [19]
Olson

[11] Patent Number: 5,923,533
[45] Date of Patent: Jul. 13, 1999

[54] MULTIPLE TILE SCALEABLE COOLING SYSTEM FOR SEMICONDUCTOR COMPONENTS

[75] Inventor: Robert Leo Olson, South St. Paul, Minn.

[73] Assignee: Lockheed Martin Corporation, Bethesda, Md.

[21] Appl. No.: 09/024,483

[22] Filed: Feb. 17, 1998

Related U.S. Application Data

[51] Int. Cl.$^6$ ...................................................... H05K 7/20
[52] U.S. Cl. .......................... 361/699; 165/80.4; 257/714
[58] Field of Search ........................... 257/714; 165/80.3, 165/80.4, 104.33; 62/259.2; 361/689, 698, 699, 717–719, 722

[56] References Cited

U.S. PATENT DOCUMENTS

| | | |
|---|---|---|
| 4,072,188 | 2/1978 | Wilson et al. ............................. 165/80 |
| 4,873,613 | 10/1989 | Iversen . |
| 5,088,005 | 2/1992 | Ciaccio . |
| 5,144,531 | 9/1992 | Go . |
| 5,150,274 | 9/1992 | Okada . |
| 5,210,440 | 5/1993 | Long . |
| 5,718,117 | 2/1998 | McDunn . |
| 5,740,018 | 4/1998 | Rombut, Jr. . |
| 5,812,372 | 9/1998 | Gaylon ..................................... 361/699 |

FOREIGN PATENT DOCUMENTS

| | | | |
|---|---|---|---|
| 2624684 | 6/1989 | France .................................... 361/699 |

*Primary Examiner*—Gerald Tolin
*Attorney, Agent, or Firm*—Glenn W. Bowen

[57] ABSTRACT

A fluid-cooling system for the edge-cooling of semiconductor tiles that are arranged into rows and columns and are mounted on one or more panels is constructed with a coolant supply and return pipe and individual coolant supply and return lines for each of the panels. Fluid flows in separate fluid-cooling passageways for each of the columns of tiles. The passageways are coupled between the coolant supply line and the coolant return line for the panel. The passageways follow a winding path that provides cooling for a major portion of the periphery of all of the tiles that are in a column and for a minor portion of the periphery of all of said tiles that are in adjacent columns. The remaining edges of the tiles in the outermost columns of tiles of a panel that are not cooled by the outermost passageways are cooled by passageway segments that direct fluid from said fluid-cooling passageways. The tiles have a rectangular shape and may contain multi-chip semiconductor modules. The supply and return lines are preferably coupled to the supply and return pipes by quick disconnect couplers.

8 Claims, 2 Drawing Sheets

MULTIPLE TILE SCALEABLE COOLING SYSTEM FOR SEMICONDUCTOR COMPONENTS

FIELD OF THE INVENTION

The invention relates to a cooling system for the cooling of semiconductor chips and other electronic components. In particular, the invention relates to the cooling of high-density multi-chip modules that are commercially available, which may be cooled by drawing heat from the edges of the multi-chip modules. The cooling system of the present invention is scaleable in that the multi-chip module tiles and each panel may be added or removed from the system without shutting the entire system down.

BACKGROUND OF THE INVENTION

The density of semiconductor integrated circuit chips is constantly increasing, as is the number of such chips used in high-speed multi-chip arrays, such as switching networks and other electronic devices. This causes an increasing problem in removing the large amount of power that is generated per chip. Another problem that occurs is that as the density of the integrated circuitry on a chip increases, the number of connectors required also increases. In the past it was common to place the connectors for the chips on the edges of the card in order to increase the density of the circuitry formed on the flat circuit card. By increasing the number of connectors, it is now required that connections be made through the flat area of the circuit chip rather than, or in addition to, the edges. In order to accommodate this multi-chip modules may be cooled by applying coolant to the edges of semiconductor chips that are arranged into tiles, which in turn are assembled into one or more panels.

U.S. Pat. No. 4,072,188, issued Feb. 7, 1978, entitled "Fluid Cooling Systems for Electronic Systems" shows a fluid cooling system that may cool a number of circuit chips arranged into panels. The cooling system, however, is not scaleable since coolant flows through the entire flow system, and the whole system must be shut down to remove or add panels. The system also requires separate flat heat sink plates for each cooled unit. A pair of flexible tubes or hoses is also required to conduit coolant to and from each of the plates.

The present invention provides independent cooling to a plurality of modules in a panel in such a manner that individual, independent semiconductor chips containing tiles may be added or removed without shutting down the remaining portions of the system, which is particularly advantageous in a network switching system. The switching network may be designed to operate in a degraded mode to remain operational while any changes are being made.

SUMMARY OF THE INVENTION

A fluid-cooling system is provided for cooling the entire periphery tiles that contain elements that require cooling and are arranged into rows and columns on one or more panels. The system includes a coolant supply and return pipe along with an individual coolant supply line for each of the panels and an individual coolant return line for each of the panels. Fluid-cooling passageways are provided for each column of said panels, which are coupled between the coolant supply line and the coolant return line for the panel. The passageways each follow a winding path that cools a major portion of the periphery of all of the tiles in a column of said columns of tiles and for a minor portion of the periphery of all of the tiles that are the adjacent columns. The outermost columns of said tiles of a panel may include passageway segments that direct fluid the fluid-cooling passageways of the outermost passageways. The fluid in these passageway segments flows past a minor portion of the periphery of those of the tiles that are in the outermost columns of tiles and that are not otherwise cooled by said outermost passageways. The tiles may have a rectangular shape and may contain multi-chip semiconductor modules. The lines and the return lines are preferably coupled to the coolant supply pipes and the coolant return pipes by quick disconnect couplers.

DESCRIPTION OF THE EMBODIMENT

Figure 1:
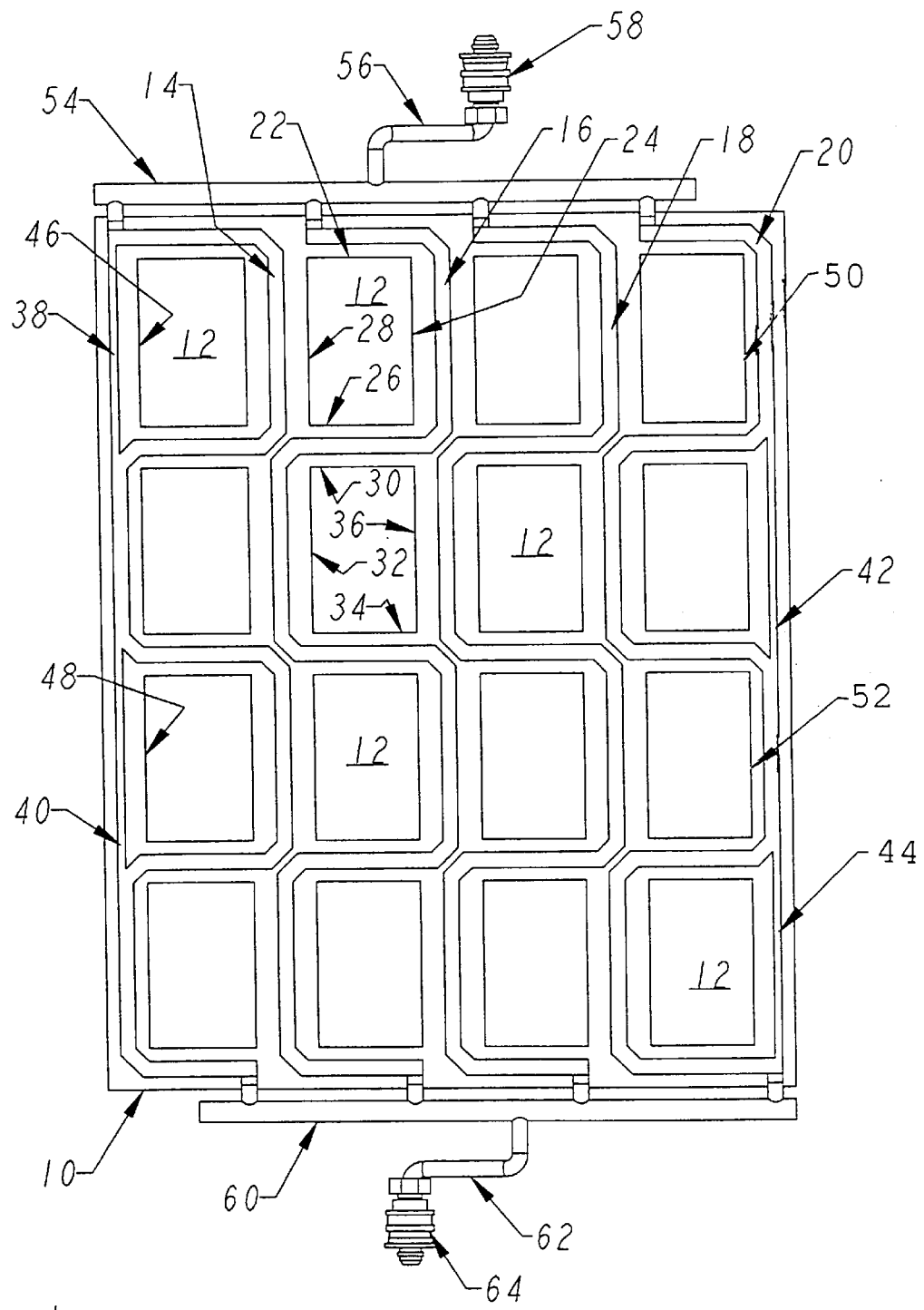
FIG. 1 is a plan view of a 4×4 multi-chip tile embodiment of the cooling system of the present invention.

FIG. 1 shows a panel 10, which contains a number of multi-chip tiles 12. In the illustrated embodiment, there are 16 tiles arranged into 4 rows and 4 columns, but any number of tiles may be employed. A series of passages 14–20 through which a coolant fluid flows are formed into patterns that bring them close to, or into contact with, the edges of the tiles 12. In this document "tile" means any element that requires cooling and "panel" means any structure which supports or carries the tiles.

Figure 2:
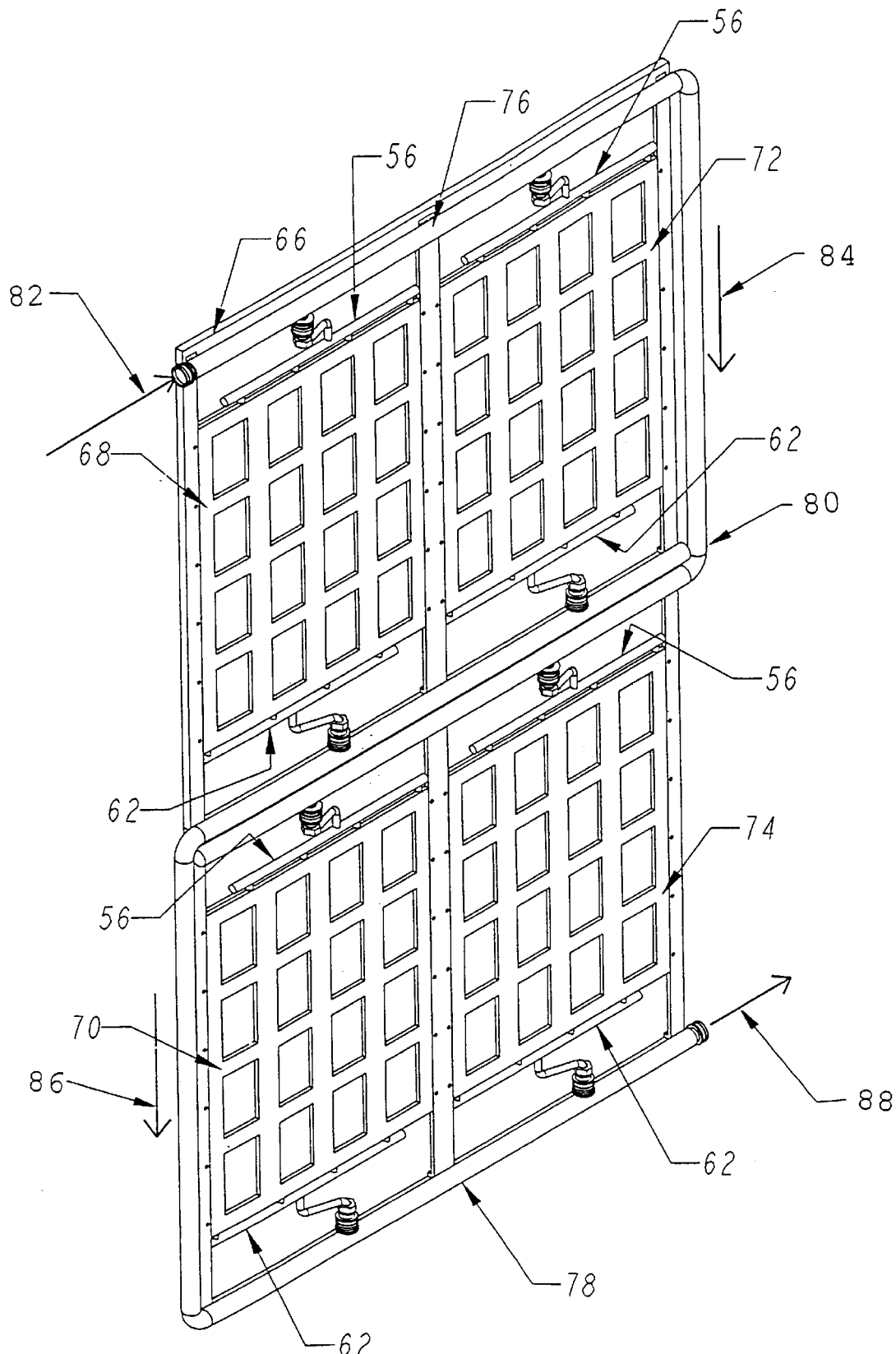
FIG. 2 is a rear tri-metric view of four independent panels of the type shown in FIG. 1 in a scaleable frame arrangement with the cooling tiles positioned on the rear side of the frame and, therefore, not visible.

For example, the cooling passageway 16 shown in FIG. 1 follows a zigzag, or winding, pattern so that it passes in proximity to three of the edges 22, 24 and 26 of the uppermost semiconductor tile 12 in the second column of tiles from the left in FIG. 2. The other edge 28 is cooled by the cooling passageway 14. The cooling passageway 16 then passes adjacent to edges 30, 32, 34 of the next lower semiconductor tile by projecting to the left instead of to the right. The right-hand edge 36 of this tile is then cooled by the coolant passageway 18. The same winding path is repeated by the cooling passageways 18 and 20.

The cooling passageways 16, 18 and any other cooling passageways that are positioned intermediate the outermost passageways 14 and 20 may be constructed in an identical manner. The outermost passageways 14 and 20 are preferably constructed so that additional flow paths, such as the passageway segments 38, 40, 42 and 44, flow adjacent the edges 46, 48, 50 and 52, respectively, which would not otherwise be contacted if all of the cooling tubes were constructed identically. The passageway segments 38, 40, 42, 44 may be narrower than the main passageway because they need to cool only one edge of one of the tiles instead of an edge of each of two tiles, as the other passageways must do. Alternately, semiconductor tiles with lower cooling requirements could be located at locations, which were contacted by passageways on only three of their edges.

The passageways 14–20 are supplied coolant at their upper end through a supply plenum 54. The supply plenum is coupled to a supply line 56, which preferably has a male quick disconnect connector 58 on its end, to allow for disconnection of a panel 10 without spillage, or with a minimum amount of spillage. Other panels in the system may continue to be operable in accordance with settings established by the system.

The lower portion of the passageways is similarly connected to a return plenum 60 into which the warmed coolant is sent from the passageways 14–20. A return supply line 62 for passageways 14–20 is coupled to the return plenum, and again a quick disconnect male connector 64 is preferably coupled to the supply line.

FIG. 2 is a rear tri-metric view of an assembled frame 66 which consists of four individual panels of FIG. 1 that are connected together to form a cooling system that may be expanded or contracted on a panel-by-panel basis without shutting down the operable semiconductor panels. The 2×2-panel frame 66 of FIG. 2 is coupled together so that each of the supply lines 56 of the panels 68–74 in the panel assembly is coupled separately to the coolant supply source (not shown) via the supply and return pipe 80. Each of the lower return lines 62 of the panels 68–74 are individually coupled to return the cooling fluid to the coolant source via the supply and return pipe 80. The cooling system of the present invention is scaleable in that the number of panels in the system may be expanded by coupling the additional supply and return lines for these panels to the supply and return pipe 80. The flow paths for the coolant are shown by the arrows 82, 84, 86, 88 in FIG. 2 wherein fluid enters the supply and return pipe 80 at the upper pipe portion 76 from the coolant source and is returned to the coolant source via the lower pipe portion 78.

The panels may be connected by using conventional connecting techniques that allow individual ones of the panels to be removed while the other panels continue to be cooled. The modular system of the invention minimizes each of the cooling paths and provides for a more evenly distributed cooling since the coolant only needs to flow through one of the panels and not through the entire system before being returned to the coolant source. While the tiles 12 are described as being rectangular in the preferred embodiment, they may be formed into other shapes, including circular or elliptic, and still come within the scope and intent of the present claims. Other modifications and variations within the scope of the present invention will be apparent to those skilled in the art.

What is claimed is:

1. A cooling system including tiles which require cooling, wherein all of the tiles of a plurality of tiles each have an encircling peripheral boundary that receives heat from the inner portion of said tile, wherein said tiles are arranged into a plurality of columns; comprising:

(a) a cooling fluid input supply line, (b) a cooling fluid output return line, (c) an individual cooling fluid column supply line for each of said columns coupled to the cooling fluid input supply line to receive cooling fluid from said cooling fluid input supply line, (d) an individual cooling fluid column return line for each of said columns coupled to the cooling fluid output return line to provide cooling fluid to said cooling fluid return line, and (e) a plurality of fluid-cooling passageways for each column of said tiles, each of which is coupled between its associated cooling fluid column supply line and its associated cooling fluid column return line and are constructed such that each passageway has a winding path that passes adjacent to a major portion of the peripheral boundary of all of said tiles that are in a given column of said columns of tiles, and adjacent to a minor portion of the peripheral boundary of all of said tiles that are in those columns of said tiles that are adjacent said given column.

2. A cooling system as claimed in claim 1 wherein said fluid-conducting passageways that cool tiles in the outermost columns of said tiles comprise passageway segments that pass adjacent to a minor portion of the peripheral boundaries of those of said tiles that are in said outermost columns of tiles and are not otherwise cooled by said passageways so as to direct cooling fluid from the outermost ones of said fluid cooling passageways past said peripheral boundaries in said outermost columns.

3. A cooling system as claimed in claim 1 wherein each of said tiles has a rectangular shape and is relatively flat with relatively large length and width dimensions and a peripheral boundary with a relatively short dimension, and said major portion of said peripheral boundary of each tile comprises substantially all of said three sides of said rectangular shape, and said minor portion of said periphery comprises substantially all of one side of said rectangular shape.

4. A cooling system as claimed in claim 1 wherein said tiles comprise multi-chip semiconductor modules.

5. A cooling system as claimed in claim 1 wherein said supply lines and said return lines are coupled respectively to said supply pipes and to said return pipes by quick disconnect couplers.

6. A cooling system as claimed in claim 2 wherein each of said tiles has a rectangular shape and is relatively flat with relatively large length and width dimensions and a peripheral boundary with a relatively short dimension, and said major portion of said peripheral boundary of each tile comprises substantially all of said three sides of said rectangular shape, and said minor portion of said periphery comprises substantially all of one side of said rectangular shape.

7. A cooling system as claimed in claim 6 wherein said tiles comprise multi-chip semiconductor modules.

8. A cooling system as claimed in claim 7 wherein said supply lines and said return lines are coupled respectively to said supply pipes and to said return pipes by quick disconnect couplers.

\* \* \* \* \*